United States Patent [19]

El-Sadi

[11] Patent Number: 4,885,516

[45] Date of Patent: Dec. 5, 1989

[54] TECHNIQUES FOR DISK SERVO TRACK FOLLOWING

[75] Inventor: Ashraf I. El-Sadi, San Jose, Calif.

[73] Assignee: Unisys Corporation, Detroit, Mich.

[21] Appl. No.: 167,230

[22] Filed: Mar. 11, 1988

Related U.S. Application Data

[63] Continuation of Ser. No. 808,706, Dec. 13, 1985, abandoned, which is a continuation of Ser. No. 560,715, Dec. 12, 1983, Pat. No. 4,577,244.

[51] Int. Cl.$^4$ .............................................. G05B 5/01
[52] U.S. Cl. .................................... 318/615; 318/611; 318/619
[58] Field of Search ............... 318/611, 615, 616, 617, 318/618, 619, 620, 621

[56] References Cited

U.S. PATENT DOCUMENTS

| | | | |
|---|---|---|---|
| 3,648,031 | 3/1972 | Neal | 318/616 X |
| 3,673,395 | 6/1972 | Tripp | 318/611 X |
| 3,808,486 | 4/1974 | Cuda et al. | 318/619 X |
| 4,010,463 | 3/1977 | Kay | 318/661 X |
| 4,030,132 | 6/1977 | Iftikar et al. | 318/617 X |
| 4,071,886 | 1/1978 | Eicher | 318/621 X |
| 4,148,452 | 4/1979 | Niesen et al. | 318/616 X |
| 4,200,827 | 4/1980 | Oswald | 318/616 X |
| 4,298,833 | 11/1981 | Edwards et al. | 318/621 X |
| 4,387,624 | 6/1983 | Bjurstrom | 318/621 X |

*Primary Examiner*—Bentsu Ro
*Attorney, Agent, or Firm*—John J. McCormack; Robert Bramson

[57] ABSTRACT

Described is a novel technique and associated arrangement for determining the noise-free value of a system parameter (e.g., head position in a disk drive) which is time variable and (usually) has a noise component as detected. The technique involves processing the (as detected) noise-including value and passing it through "Second Order/Summing" filter means.

For instance, the technique is described as particularly useful with the "track-following servo" (part of the transducer positioning means) in a high density disk file (where track density is higher than usual) to secure superior head-displacement error values which are more noise-free. Thus, (see FIG. 4), a pair of first values $V_a$, $V_b$ are secured by detecting motor current sense voltage $V_i$, integrating it with respect to time and passing the result through a pair of novel "second order filter" means—one band-pass ($F_1$) the other low-pass ($F_2$); while also securing a third value $V_c$ by detecting position error (signal voltage, including noise components) in the usual manner and passing it through a "second order low-pass" filter $F_3$; then algebraically summing these to secure a relatively noise-free position error signal $V_{xo}$ $$[V_{xo} = V_a + V_b + V_c]$$

Thus, the summing filter array gates the position-error voltage but attenuates the (mechanical) noise component (cf. filters $F_2$, $F_1$ centerd at $w_o$—e.g., 600 Hz is satisfactory here).

Such "second order" filters are novel in themselves, and particularly as so applied (most especially as so-used in such a servo system).

4 Claims, 6 Drawing Sheets

FIG.5. 600 HZ SUMMING LSI FILTER.
TRACK FOLLOWING MODE

TECHNIQUES FOR DISK SERVO TRACK FOLLOWING

This is a continuation of U.S. Ser. No. 808,706, filed Dec. 13, 1985, now abandoned, which is a Continuation of U.S. Ser. No. 560,715, filed Dec. 12, 1983, now issued as U.S. Pat. No. 4,577,244; my related U.S. Ser. No. 543,688 has issued as U.S. No. 4,642,541.

This case relates to technique and apparatus for high speed digital magnetic recording on disks; and, more particularly, to improved techniques for positioning transducers (heads) therefor.

BACKGROUND

Features

The following is directed toward improved "track-following servo-mechanisms". A "track-following-servo" is a part of the servo-mechanism used in a disk file for head-positioning. Its function is to maintain the position of the recording heads exactly over the center of a selected disk track, with minimum displacement error, despite the presence of disturbances.

A major challenge in the design of a "track-following-servo" today is to maximize band-width and so minimize both "settling time" and "displacement errors"—while still assuring system stability and freedom from oscillations.

Servo Mechanism Dynamics

A typical disk drive head-positioning structure is shown in FIG. 1. Workers will recognize a set of heads carried (by suspension arms) on a carriage which is very precisely, selectively reciprocated along a prescribed linear path (over certain disk tracks) by a voice coil motor or the like (some details not spelled-out, but well known in the art). The head positioning servo-mechanism will be understood as including such heads, support-arms, carriage and bearings, etc. These provide rectilinear motion via the moving coil armature (attached to the carriage) in the presence of a permanent magnet (not shown).

The force F produced by such a motor is directly proportional to armature current i; thus:

$$F = K_E i.$$

where
F is Force (lbs.)
$K_E$ is "Force const." (lbs./amps)
i is coil current (amperes)

For an ideal demodulator, detected head-position is linearly proportional to the actual displacement of the heads on the disk surface. Thus:

$$V_x = K_x X,$$

where:
$V_x$ is position signal (in volts V)
$K_x$ is "position coefficient" (V/inch)
X is head displacement (inches)

The "current sense" voltage $V_i$ is a function of motor current i.

$$i = K_i \cdot V_i,$$

$$F = M \ddot{X}$$

From the above:

$$V_i = \frac{M}{K_E K_x K_i} \qquad (1)$$

where
$V_i$: Current sense voltage
M: Mass in lbs. sec²/inch
$K_E$: Force constant lbs./amp.
$K_i$: Current resolution amps/volt.
$K_i$: Current resolution amps/volt.
$K_x$: Displacement coefficient volts/inch
$V_x$: Position signal volts
S: Laplace coefficient 1/sec So, if one plots the transfer function of the position signal to the current sense voltage, he may expect a "double integration" response. The result of so measuring is indicated in the FIG. 2 curve.

From FIG. 2, we can see that the "double integration" response is only valid at frequencies below about 1 KHz. Various resonances in the actuator and head-suspension will evidently cause increasing departures from the ideal response above 1 KHz.

Track Following Servo Bandwidth

Because of the double integration, the "closed-loop" response of the servo would exhibit undamped simple harmonic motion (zero phase margin). As a result, one might prescribe some "compensator means" to advance the phase at the open loop unit gain.

Some workers might prescribe an integrator to give increased "d.c. stiffness"; they might use a "sharp-cutoff second order lowpass filter" to reduce the effect of mechanical resonances. A "double lead/lag network" might be used to maximize the phase advance around the unity gain frequency to achieve a desirable "settling characteristic".

Increasing the servo bandwidth (while holding other parameters constant) will be understood as reducing track following error (due to radial runout of the tracks at the disk rotational frequency and due to static forces produced by imperfections in the carriage bearings or cooling air circulating past the carriage). Increasing bandwidth also reduces "settling time" (after a seek between tracks) and so reduces access time—something highly desirable! The upper limit on bandwidth will be controlled by the need to maintain stability in the presence of high-frequency mechanical-structural resonances.

In a certain disk file of "moderate-high" track density, it is found that a bandwidth 360 Hz brings "off-track" errors to less than 100μ inches (usually satisfactory for the postulated track density). For a higher track density, the bandwidth should be increased; e.g., by improvements in mechanical design and/or by electronic design improvements.

Improving in mechanical design will aim to lower the magnitude of these resonances or to increase "center frequencies". But such improvements usually prove very costly.

Another, somewhat conventional approach is to improve the electronic design using "notch filters" to suppress the mechanical resonances peaks. This will typically be ineffective because these frequencies are distributed over too-wide a frequency span.

However, my solution (below) is a new approach which will lift the limitations on the bandwidth of a "track following servo" in such a disk file (due to mechanical resonances). It is called a "second order summing filter".

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings, wherein like reference symbols denote like elements.

DESCRIPTION OF THE PREFERRED EMBODIMENT

General description, background

Figure 4:
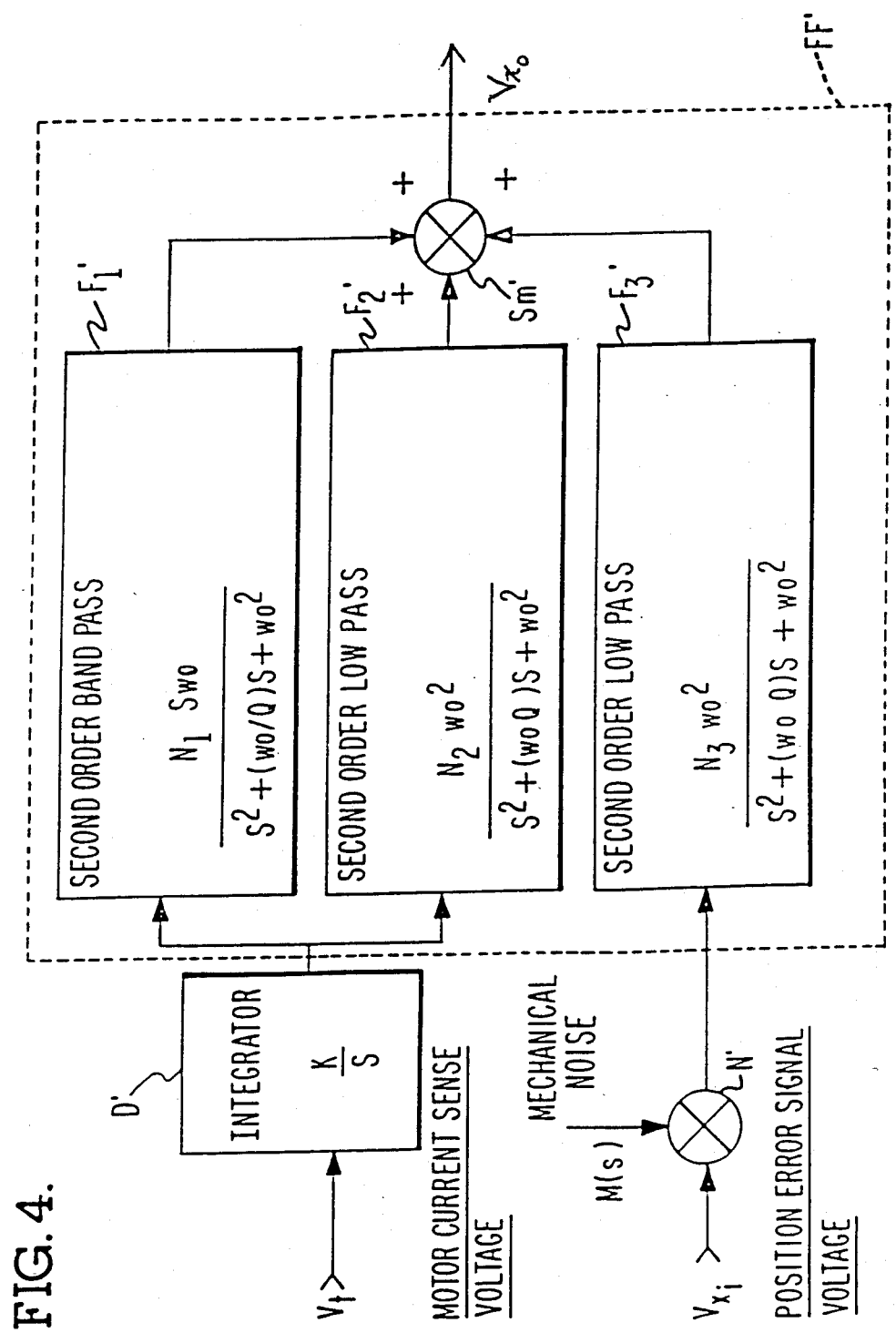
FIG. 4 is a more particular block diagram along the lines of FIG. 3.
Figure 5:
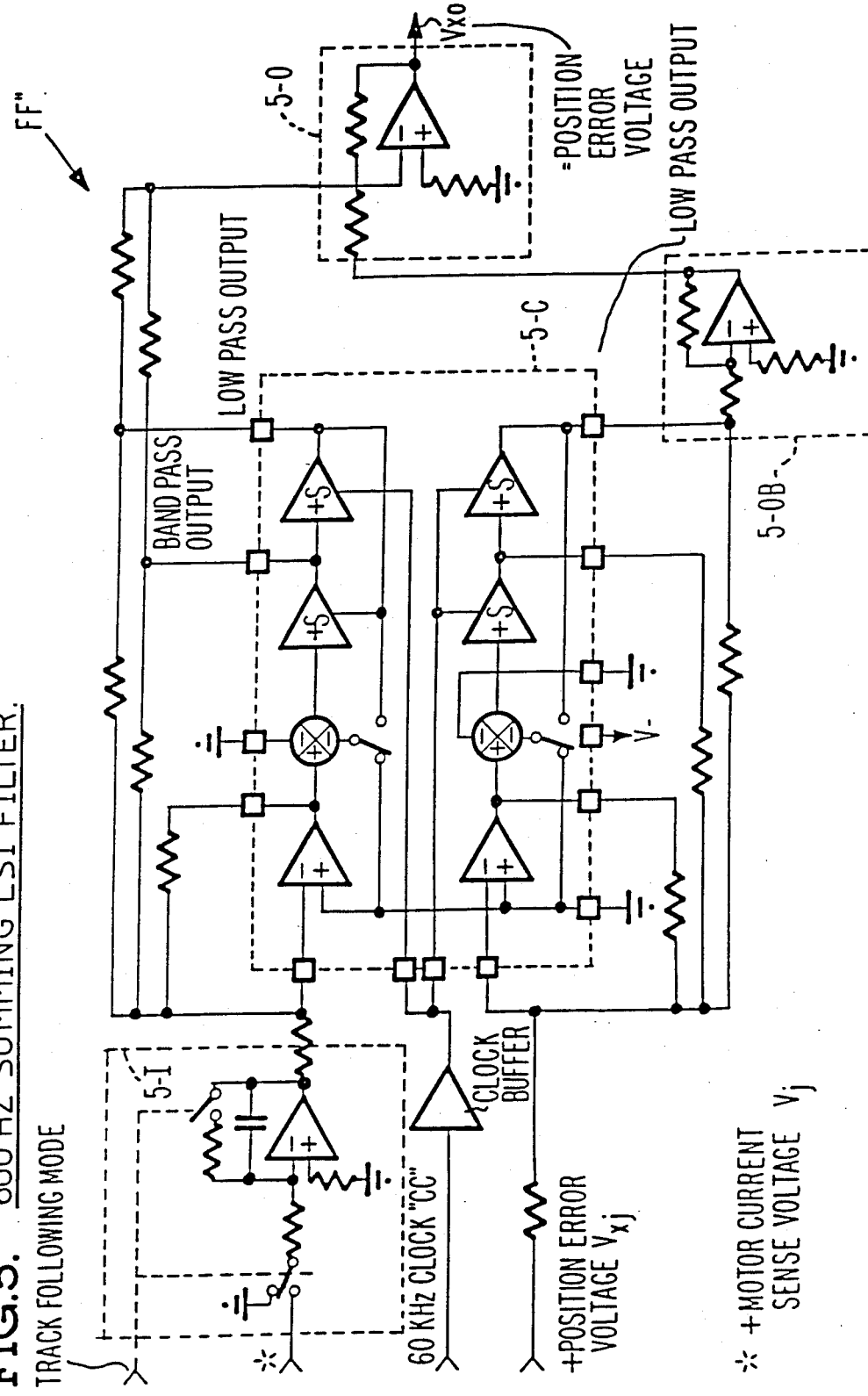
FIG. 5 is a preferred circuit modified implementation.

FIG. 4 schematically illustrates a "second order summing filter" FF' constructed according to principles of this invention (modified implementation in the circuit of FIG. 5). This, and other means discussed herein, will generally be understood as constructed and operating as presently known in the art, except where otherwise specified. And, except as otherwise specified, all materials, methods and devices and apparatus herein will be understood as implemented by known expedients according to present good practice.

Theory

The theory of such a "second order summing filter" is given as follows.

if $Y(s) = \frac{F(S)}{G(S)} \times (s) \, s = S$ if $F(S) = G(S)$ then $Y(s) = X(s)$ and $Y(t) = X(t)$ if Y(t) and X(t) are both continuous. A given function cannot have more than one inverse laplace transform continuous for all $t > 0$ (Lerch's theorem).

from that:

$$X(S) = \frac{S^2 + (w_o/Q)S + w_o^2}{S^2 + (w_o/Q)S + w_o^2} X(s) =$$

$$\frac{S}{S^2 + (w_o/Q)S + w_o^2} SX(S) +$$

$$\frac{w_o/Q}{S^2 + (w_o/Q)S + w_o^2} SX(S) + \frac{w_o^2}{S^2 + (w_o/Q)S + w_o^2} X(S)$$

The canonical form of a second-order low-pass transfer function is:

$$L(s) = \frac{w_o^2}{S^2 + (w_o/Q)S + w_o^2}$$

The canonical form of a second-order band-pass transfer function is:

$$B(s) = \frac{Sw_o}{S^2 + (w_o/Q)S + w_o^2}$$

Thus, $X(s) = \frac{S}{w_o} B(s) X(S) + \frac{S}{Qw_o} L(s) X(S) + L(s) X(S)$

Figure 1:
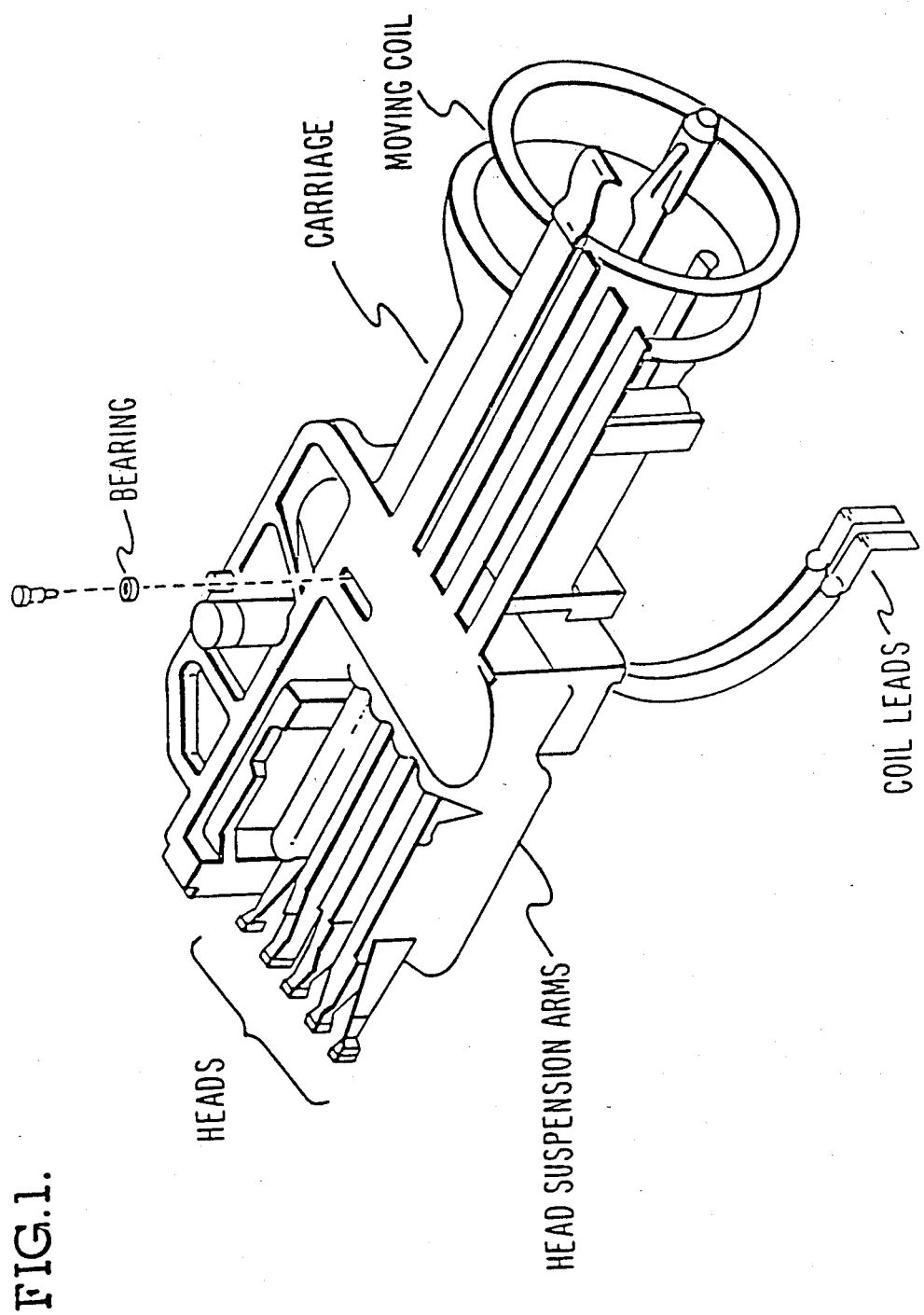
FIG. 1 is a perspective schematic idealized view of a typical multi-head carriage.
Figure 2:
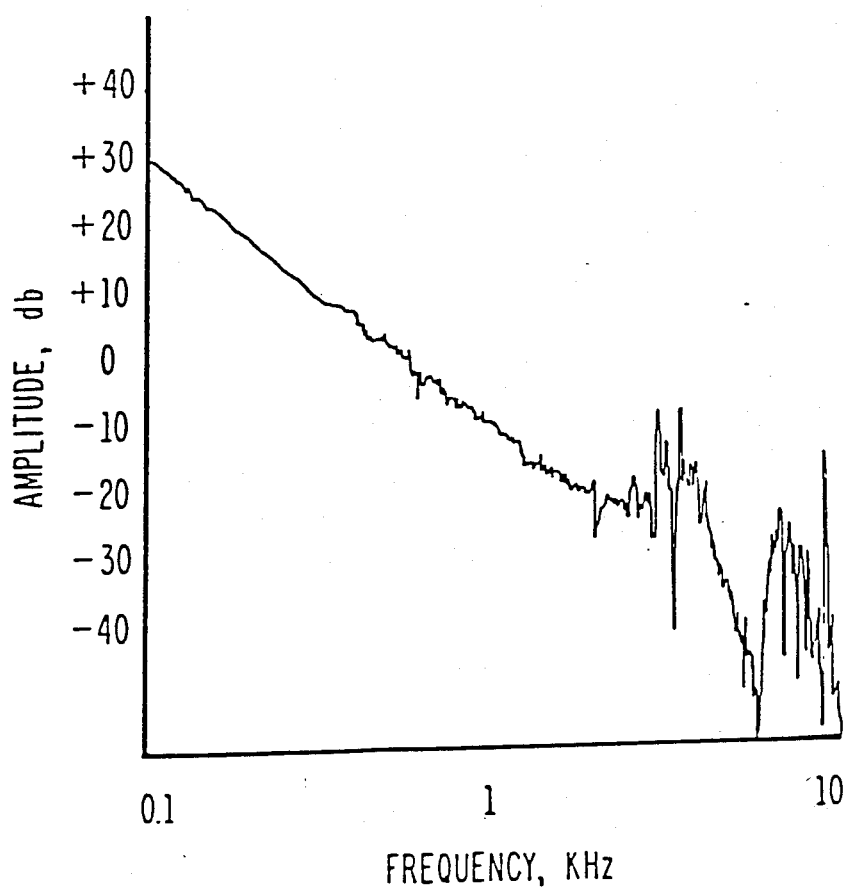
FIG. 2 is a plot of position error vs. frequency typical of such an array.
Figure 3:
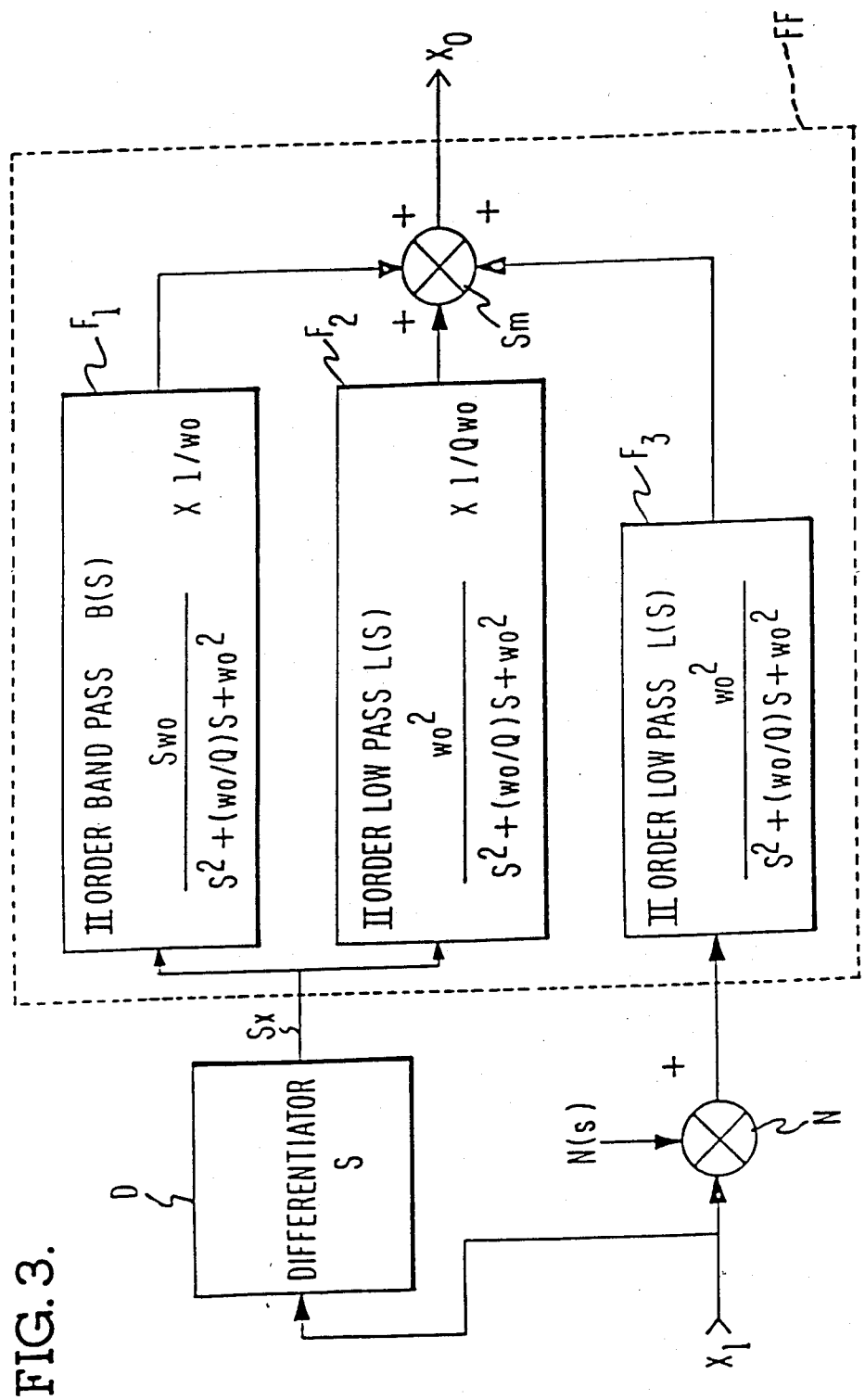
FIG. 3 is a block diagram of my (theoretical) improvement in track-following servo systems for such apparatus.

The previous relationship can be represented by the block diagram in FIG. 3 [here assume N(s)=o] and assume:

$W_o$ = break frequency of summing filter
$Q$ = inverse of the damping factor
$x_i$ = input displacement value (to summ. filter)
$x_o$ = output displacement value (to summ. filter)

then $x_i = x_o$ if N(s) is introduced $$X_o = X_i + \frac{w_o^2}{S^2 + (w_o/Q)S + w_o^2} N(s)$$

This mathematical model of a "second order summing filter" will be seen as useful to solve the problem of limited bandwidth in the disc files track following servo (e.g., as in FIGS. 4, 5 discussed below).

EXAMPLE I (FIGS. 4, 5)

FIG. 4 will be understood as a block diagram implementation of such a "second order summing filter" (here FF') for a high density disk file which is characterized by a need for better "position error" servo information.

Here, the position information in a subject disk file will be understood as decoded from the read-back signal of the head. This signal contains, besides the actual position information, an additional noise component, caused by resonance (e.g., at higher frequencies) in the head suspension assembly and the carriage-actuator assembly. Now, the current signal (passing through the coil) will be free of such "mechanical noise components", looking to the system as an "open loop". So, if we could perfectly decode position information from the actuator current signal, the produced signal would represent actual displacement free of any mechanical noise component. Unfortunately, this cannot be done because the necessary pre-conditions are not feasible.

Looking to FIG. 4, a block diagram of the summing filter FF': if x represents the position error signal ($V_x$), we can replace the term Sx by the integral of the motor current (i):

Here assume that:
$V_{xi}$ is input voltage representing position error
$V_{xo}$ is output voltage representing position error and where
K: Integrator constant
$N_1$: Band pass gain
$N_2, N_3$: Low pass gain
If we satisfy the condition of summing filter FF':

$$V_{xo} = N_3 V_{x1} + \frac{N_3 w_o^2}{S^2 + w_o/QS + w_o^2} M(s)$$

This means the summing filter FF' will gate the position error voltage but attenuate the mechanical noise by a second-order low-pass filter centered at $w_o$.

Condition of summing filter, using the above as implemented per the block diagram $$V_{xo} = \frac{KMN_1W_o}{K_E K_x K_i} \cdot \frac{S^2 + (N_2/N_1)w_oS + (N_3K_xK_EK_i/N_1KM)w_o}{S^2 + (w_o/Q)S + w_o^2} V_{xi} + \frac{N_3 w_o^2}{S^2 + (w_o/Q)S + w_o^2} M(s)$$

If we select $$N_1/N_2 = Q$$
$$N_1/N_3 = K_x K_E K_i/W_o KM$$

The previous equation reduces to $$V_{xo} = N_3 V_x + \frac{N_3 w_o^2}{S^2 + (w_o/Q)S + w_o^2} M(s)$$

Implementing FIGS. 3, 4

The (very general) technique indicated in FIG. 3 will be seen as, essentially, merely requiring that a time-variable quantity $X_i$ (like position-error signal) that has an undue "noise component" (e.g., because of the way that signal is generated and/or the way it is detected) be coupled to a "summing filter" arrangement FF—i.e., to a "second order low pass" filter stage $F_3$ and its time-differentiated version (e.g., via a differentiator stage D) be coupled to a pair of "second order" filters connected in parallel ($F_1$, a band-pass type; $F_2$ a low-pass type)—with all filter outputs coupled to summing means $S_m$ whereby to provide the desired "low-noise" version $X_o$ of this quantity (these filters and summing means comprising the "summing filter" FF).

Workers will recognize that, while such "second order" filters are known as such (e.g., the electrical circuit version), the indicated arrangement thereof as the taught "Summing Filter" array is novel and advantageous for many applications.

For instance, workers in the communication arts will appreciate how one may thusly remove (or at least reduce) the noise component of many sorts of time-varying, noise-bearing signals—by passing them through a like "second order low-pass" filter stage; and applying their time-derivative to both a "second order low pass" filter stage and also, in parallel, to a "second order band-pass" filter stage (such circuits are known in the art; e.g., one may construct such of discrete components, or use integrated circuit means); one need only specify the value of frequency $w_o$ and "inverse damping-factor Q—then summing all filter outputs.

Now, workers have doubtless considered using various forms of "second order" filters, alone (e.g., low-pass $F_3$ by itself); but would have realized (or discovered) that the output realized is too attenuated and/or too "noisy" to be of much value.

Also, various mechanical analogs (e.g., fluid systems) will occur to related workers. Also, acoustic analogs will be contemplated, as will the optical type.

Turning to FIG. 4, the general arrangement of FIG. 3 will be understood as specified for a disk drive or related system, when one wants to process a time-variant, noise-containing quantity like "position error" signal voltage $V_{xi}$ to derive a relatively "true" low-noise version thereof $V_{xo}$—having a related detectible quantity (like "motor current sense voltage" $V_i$) that is more reflective of the "low-noise" version (here $V_i$ is seen to reflect head position-change, once it is integrated with respect to time—i.e., in a linear actuator one may assume that change in current/voltage is proportional to the time derivative of velocity or the time-integral of acceleration.

Hence, applying signal $V_{xi}$ to a filter stage $F_3'$ (like $F_3$) and, applying $\int_t V_i$ to both filter stages $F_1'$ and $F_2'$ (like $F_1$, $F_2$—specifying $w_o$ and Q for all filters) and summing filter outputs can yield $V_{xo}$, a "low noise" version of $V_{xi}$. Workers will contemplate known filter circuits implementing this summing filter FF'.

In like manner, one may implement the arrangement of FIG. 4 in "chip" (integrated circuit) form. One, preferred such form somewhat modified is indicated on the circuit of FIG. 5 where an LSI "switching-capacitor integrated/state variable filter" chip 5-C of known type (e.g., by National Semiconductor) is used with related circuit means in a "600 Hz LSI Summing Filter". Here, workers will understand that input stage S-I will provide an integrating operation (cf. D'), that output stage 5-O operates to sum and amplify the filter-outputs (cf. $S_m'$) and that an "offset balance-amplifier stage "5-OB" is also preferably used to compensate for any "offset" in chip output. The clock input "cc" will be understood to be used as necessary to adjust output errors (due to capacitance—variance—e.g., from about 5% to about 0.1%—the clock adjusting gain to be independent of capacitance or of clock rate).

Figure 6:
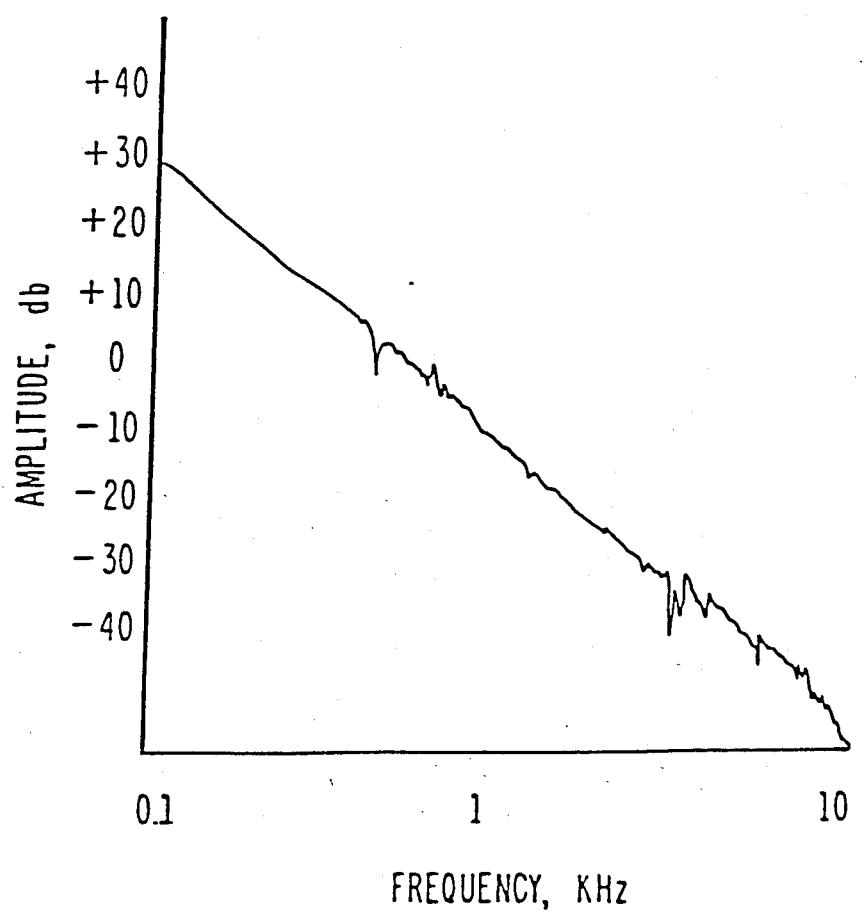
FIG. 6 is a plot of associated results, along the lines of FIG. 2.

Measuring the transfer function between the motor current sense voltage and the output of the summing filter (position error voltage) is exemplified in FIG. 6. The summing filter will be understood as placed at 600 Hz.

It will be understood that the preferred embodiments described herein are only exemplary, and that the invention is capable of many modifications and variations in construction, arrangement and use without departing from the spirit of the invention.

Further modifications of the invention are also possible. For example, the means and methods disclosed herein are also applicable to other high density disk files, as well as to related systems. Also, the present invention is applicable for enhancing other forms of time-variant, "noisy" signals as mentioned.

The above examples of possible variations of the present invention are merely illustrative. Accordingly, the present invention is to be considered as including all possible modifications and variations coming within the scope of the invention as defined by the appended claims.

What is claimed is:

1. An arrangement SS for controlling automatic high speed positioning motor means associated with a track-following servo in a disk drive for a high-density disk file, for determining relatively noise-free head-position-error signals ($X_o$), said arrangement SS being characterized by position-error signals with significant undesirable related noise components, including resonance and other "mechanical" noise plus "electrical" noise, this control arrangement SS comprising:

a time-variant signal input means I adapted to accept time-variant position-error signals, t-S, including noise components thereof;

filter means FF coupled to receive the output of said input means I and comprising a second order low pass filter stage, also including circuit means adapted to automatically process the prescribed noise-including position-error signals t-S along with motor-current signals m-s, said second order low pass filter stage operating at a prescribed center-frequency range to implement a prescribed transfer function; said filter means FF also being adapted to apply the time variant position-error signals, t-S being time-differentiated, to other second order filter means; and summing means SM adapted to receive the output of the filter means, whereby to derive a low-noise representation of said time-variant position-error signals t-S without excessive attenuation thereof.

2. The arrangement as recited in claim 1, wherein a portion of said filter means comprises input differentiator means plus a second order, band-pass filter stage and a second-order, low-pass filter stage, these stages coupled in parallel between said input differentiator means and said summing means.

3. The arrangement as recited in claim 1, characterized by:

a first input means adapted to receive position error signals and related noise components;

a first second-order filter means coupled to receive the output of said first input means;

a second input means adapted to receive motor signals reflecting current change in said motor means, over time, the current change related to velocity change in said motor means; and a second second-order filter means coupled to said second input means.

4. The arrangement as recited in claim 1, wherein said filter means also comprises input differentiator means plus a second order band-pass filter stage and a second-order, low-pass filter stage, these stages coupled in parallel between said input differentiator means and said summing means.

* * * * *